United States Patent
Knobloch et al.

(10) Patent No.: US 7,846,838 B2
(45) Date of Patent: Dec. 7, 2010

(54) METHOD FOR PRODUCING AN ELECTRONIC COMPONENT

(75) Inventors: Alexander Knobloch, Erlangen (DE); Andreas Ullmann, Zirndorf (DE); Walter Fix, Nuremberg (DE); Merlin Welker, Baiersdorf (DE)

(73) Assignee: Polyic GmbH & Co. KG, Furth (DE)

( * ) Notice: Subject to any disclaimer, the term of this patent is extended or adjusted under 35 U.S.C. 154(b) by 310 days.

(21) Appl. No.: 11/997,235

(22) PCT Filed: Jul. 27, 2006

(86) PCT No.: PCT/EP2006/007441
§ 371 (c)(1), (2), (4) Date: Feb. 28, 2008

(87) PCT Pub. No.: WO2007/014694
PCT Pub. Date: Feb. 8, 2007

(65) Prior Publication Data
US 2008/0200030 A1  Aug. 21, 2008

(30) Foreign Application Priority Data
Jul. 29, 2005 (DE) .................. 10 2005 035 589

(51) Int. Cl.
*H01L 21/44* (2006.01)
*H01L 29/08* (2006.01)
*H01L 35/24* (2006.01)
*H01L 51/00* (2006.01)

(52) U.S. Cl. .................. 438/678; 257/40; 257/E21.476

(58) Field of Classification Search .................. 438/678
See application file for complete search history.

(56) References Cited

U.S. PATENT DOCUMENTS 3,512,052 A  5/1970  MacIver et al.
3,769,096 A  10/1973  Ashkin
(Continued)

FOREIGN PATENT DOCUMENTS

AU  488652  4/1976
(Continued)

OTHER PUBLICATIONS

Burghart M. et al., "Evaluation of reel-to-reel processes for polymer electronics" 3. International IEEE Conference on Polymers and Adhesives in Microelectronics and Photonics, Polytronic 2003, Oct. 20, 2003, pp. 287-293.
(Continued)

*Primary Examiner*—Ha Tran T Nguyen
*Assistant Examiner*—Valerie Brown
(74) *Attorney, Agent, or Firm*—Carella, Byrne et al.; Elliot M. Olstein; William Squire

(57) ABSTRACT

The invention relates to a method for producing an electronic component on a surface of a substrate with the electronic component having, seen at right angles to the surface of the substrate, at least two electrical functional layers which are arranged one above the other and such that they overlap at least in a surface area F, with the at least two electrical functional layers on the substrate being structured directly or indirectly using a continuous process, with a first electrical functional layer of the at least two electrical functional layers being structured such that a first length/width dimension of the first electrical functional layer parallel to the surface of the substrate and in a relative movement direction of the substrate is at least 5 μm longer/wider, preferably more than 1 mm longer/wider, than a length/width dimension of the surface area F in the relative movement direction and parallel to the surface of the substrate.

18 Claims, 6 Drawing Sheets

U.S. PATENT DOCUMENTS

| | | | |
|---|---|---|---|
| 3,955,098 A | 5/1976 | Kawamoto |
| 3,999,122 A | 12/1976 | Winstel et al. |
| 4,246,298 A | 1/1981 | Guarnery |
| 4,302,648 A | 11/1981 | Sado et al. |
| 4,340,057 A | 7/1982 | Bloch |
| 4,442,019 A | 4/1984 | Marks |
| 4,472,627 A | 9/1984 | Weinberger |
| 4,554,229 A | 11/1985 | Small |
| 4,865,197 A | 9/1989 | Craig |
| 4,926,052 A | 5/1990 | Hatayama |
| 4,937,119 A | 6/1990 | Nikles et al. |
| 5,053,679 A | 10/1991 | Thioulouse |
| 5,075,816 A | 12/1991 | Stormbom |
| 5,173,835 A | 12/1992 | Cornett et al. |
| 5,202,677 A | 4/1993 | Parker et al. |
| 5,206,525 A | 4/1993 | Yamamoto et al. |
| 5,259,926 A | 11/1993 | Kuwabara et al. |
| 5,321,240 A | 6/1994 | Takahira |
| 5,347,144 A | 9/1994 | Garnier et al. |
| 5,364,735 A | 11/1994 | Akamatsu |
| 5,395,504 A | 3/1995 | Hoffman et al. |
| 5,480,839 A | 1/1996 | Ezawa et al. |
| 5,486,851 A | 1/1996 | Gehner et al. |
| 5,502,396 A | 3/1996 | Desarzens |
| 5,528,222 A | 6/1996 | Moskowitz |
| 5,546,889 A | 8/1996 | Wakita et al. |
| 5,569,879 A | 10/1996 | Gloton |
| 5,574,291 A | 11/1996 | Dodabalapur et al. |
| 5,578,513 A | 11/1996 | Maegawa |
| 5,580,794 A | 12/1996 | Allen |
| 5,625,199 A | 4/1997 | Baumbach et al. |
| 5,625,474 A | 4/1997 | Aomori et al. |
| 5,629,530 A | 5/1997 | Brown et al. |
| 5,630,986 A | 5/1997 | Charlton |
| 5,652,645 A | 7/1997 | Jain |
| 5,691,089 A | 11/1997 | Smayling |
| 5,693,956 A | 12/1997 | Shi |
| 5,705,826 A | 1/1998 | Aratani et al. |
| 5,707,894 A | 1/1998 | Hsiao |
| 5,729,428 A | 3/1998 | Sakata et al. |
| 5,854,139 A | 12/1998 | Kondo et al. |
| 5,869,972 A | 2/1999 | Birch et al. |
| 5,883,397 A | 3/1999 | Isoda et al. |
| 5,892,244 A | 4/1999 | Tanaka et al. |
| 5,946,551 A | 8/1999 | Dimitrakopoulos |
| 5,967,048 A | 10/1999 | Fromson et al. |
| 5,970,318 A | 10/1999 | Choi et al. |
| 5,973,598 A | 10/1999 | Beigel |
| 5,994,773 A | 11/1999 | Hirakawa |
| 5,997,817 A | 12/1999 | Crismore et al. |
| 5,998,805 A | 12/1999 | Shi et al. |
| 6,036,919 A | 3/2000 | Thym et al. |
| 6,045,977 A | 4/2000 | Chandross et al. |
| 6,060,338 A | 5/2000 | Tanaka et al. |
| 6,072,716 A | 6/2000 | Jacobsen et al. |
| 6,083,104 A | 7/2000 | Choi |
| 6,087,196 A | 7/2000 | Sturm et al. |
| 6,107,920 A | 8/2000 | Eberhardt et al. |
| 6,133,835 A | 10/2000 | DeLeeuw et al. |
| 6,150,668 A | 11/2000 | Bao |
| 6,180,956 B1 | 1/2001 | Chondroudis |
| 6,197,663 B1 | 3/2001 | Chandross |
| 6,207,472 B1 | 3/2001 | Callegari et al. |
| 6,215,130 B1 | 4/2001 | Dodabalapur |
| 6,221,553 B1 | 4/2001 | Wolk |
| 6,251,513 B1 | 6/2001 | Rector |
| 6,259,506 B1 | 7/2001 | Lawandy |
| 6,284,562 B1 | 9/2001 | Batlogg et al. |
| 6,291,126 B2 | 9/2001 | Wolk et al. |
| 6,300,141 B1 | 10/2001 | Segal et al. |
| 6,321,571 B1 | 11/2001 | Themont et al. |
| 6,322,736 B1 | 11/2001 | Bao |
| 6,326,288 B1 | 12/2001 | Bornefeld |
| 6,329,226 B1 | 12/2001 | Jones |
| 6,330,464 B1 | 12/2001 | Colvin |
| 6,335,539 B1 | 1/2002 | Dimitrakopoulos et al. |
| 6,340,822 B1 | 1/2002 | Brown et al. |
| 6,344,662 B1 | 2/2002 | Dimitrakopoulos et al. |
| 6,362,509 B1 | 3/2002 | Hart |
| 6,366,017 B1 | 4/2002 | Antoniadis et al. |
| 6,369,793 B1 | 4/2002 | Parker |
| 6,384,804 B1 | 5/2002 | Dodabalapur et al. |
| 6,403,396 B1 | 6/2002 | Gudesen et al. |
| 6,414,728 B1 | 7/2002 | Faris et al. |
| 6,429,450 B1 | 8/2002 | Mutsaers et al. |
| 6,483,473 B1 | 11/2002 | King et al. |
| 6,498,114 B1 | 12/2002 | Amundson et al. |
| 6,517,995 B1 | 2/2003 | Jacobsen et al. |
| 6,518,949 B2 | 2/2003 | Drzaic |
| 6,521,109 B1 | 2/2003 | Bartic et al. |
| 6,528,816 B1 | 3/2003 | Jackson et al. |
| 6,541,130 B2 | 4/2003 | Fukada |
| 6,548,875 B2 | 4/2003 | Nishiyama |
| 6,555,840 B1 | 4/2003 | Hudson |
| 6,566,156 B1 | 5/2003 | Sturm et al. |
| 6,593,690 B1 | 7/2003 | McCormick |
| 6,596,569 B1 | 7/2003 | Bao et al. |
| 6,603,139 B1 | 8/2003 | Tessler |
| 6,621,098 B1 | 9/2003 | Jackson |
| 6,686,693 B1 | 2/2004 | Ogawa |
| 6,699,728 B2 | 3/2004 | Guenther et al. |
| 6,736,985 B1 | 5/2004 | Bao et al. |
| 6,852,583 B2 | 2/2005 | Bernds et al. |
| 6,859,093 B1 | 2/2005 | Beigel |
| 6,903,958 B2 | 6/2005 | Bernds et al. |
| 6,960,489 B2 | 11/2005 | Bernds et al. |
| 7,064,345 B2 | 6/2006 | Fix et al. |
| 7,223,995 B2 | 5/2007 | Fix et al. |
| 7,229,868 B2 | 6/2007 | Bernds et al. |
| 7,238,961 B2 | 7/2007 | Bernds et al. |
| 7,329,559 B2 | 2/2008 | Bernds et al. |
| 2001/0006846 A1 | 7/2001 | Cao et al. |
| 2001/0026187 A1 | 10/2001 | Oku |
| 2001/0046081 A1 | 11/2001 | Hayashi et al. |
| 2001/0048341 A1 | 12/2001 | Chakravarthy |
| 2002/0013013 A1 | 1/2002 | Victor |
| 2002/0018911 A1 | 2/2002 | Bernius et al. |
| 2002/0022284 A1 | 2/2002 | Heeger |
| 2002/0025391 A1 | 2/2002 | Angelopoulos |
| 2002/0053320 A1 | 5/2002 | Duthaler |
| 2002/0056839 A1 | 5/2002 | Joo et al. |
| 2002/0068392 A1 | 6/2002 | Lee et al. |
| 2002/0130042 A1 | 9/2002 | Moerman et al. |
| 2002/0170897 A1 | 11/2002 | Hall |
| 2002/0195644 A1 | 12/2002 | Dodabalapur et al. |
| 2003/0059987 A1 | 3/2003 | Sirringhaus et al. |
| 2003/0070500 A1 | 4/2003 | Hung |
| 2003/0112576 A1 | 6/2003 | Brewer et al. |
| 2003/0141807 A1 | 7/2003 | Kawase |
| 2003/0178620 A1 | 9/2003 | Bernds et al. |
| 2003/0227664 A1 | 12/2003 | Agrawal et al. |
| 2004/0002176 A1 | 1/2004 | Xu |
| 2004/0013982 A1 | 1/2004 | Jacobson et al. |
| 2004/0026689 A1 | 2/2004 | Bernds et al. |
| 2004/0029310 A1 | 2/2004 | Bernds et al. |
| 2004/0063267 A1 | 4/2004 | Bernds et al. |
| 2004/0084670 A1 | 5/2004 | Tripsas et al. |
| 2004/0092196 A1 | 5/2004 | Van De Witte et al. |
| 2004/0119504 A1 | 6/2004 | Baude et al. |
| 2004/0160389 A1 | 8/2004 | Suyama et al. |
| 2004/0211329 A1 | 10/2004 | Funahata et al. |
| 2004/0233065 A1 | 11/2004 | Freeman |
| 2004/0239586 A1 | 12/2004 | Cok |
| 2004/0246413 A1 | 12/2004 | Stephenson et al. |

| | | |
|---|---|---|
| 2004/0256467 A1 | 12/2004 | Clemens et al. |
| 2005/0051770 A1 | 3/2005 | Ando et al. |
| 2005/0062066 A1 | 3/2005 | Bao et al. |
| 2005/0098775 A1 | 5/2005 | Kondo |
| 2005/0127357 A1 | 6/2005 | Wong et al. |
| 2005/0168340 A1 | 8/2005 | Mosher et al. |

FOREIGN PATENT DOCUMENTS

| | | |
|---|---|---|
| DE | 2102735 | 8/1972 |
| DE | 33 38 597 | 5/1985 |
| DE | 37 05 109 | 8/1987 |
| DE | 41 03 675 | 8/1992 |
| DE | 692 32 740 T2 | 4/1993 |
| DE | 42 43 832 | 6/1994 |
| DE | 43 12 766 | 10/1994 |
| DE | 196 29 291 | 1/1997 |
| DE | 196 48 937 | 5/1997 |
| DE | 196 10 284 | 8/1997 |
| DE | 195 06 907 | 9/1998 |
| DE | 198 52 312 | 5/1999 |
| DE | 198 16 860 | 11/1999 |
| DE | 199 18 193 | 11/1999 |
| DE | 198 51 703 | 5/2000 |
| DE | 100 06 257 | 9/2000 |
| DE | 199 21 024 | 11/2000 |
| DE | 199 33 757 | 1/2001 |
| DE | 695 19 782 | 1/2001 |
| DE | 199 35 527 | 2/2001 |
| DE | 199 37 262 | 3/2001 |
| DE | 100 12 204 | 9/2001 |
| DE | 100 33 112 | 1/2002 |
| DE | 201 11 825 | 2/2002 |
| DE | 100 43 204 | 4/2002 |
| DE | 100 45 192 | 4/2002 |
| DE | 100 47 171 | 4/2002 |
| DE | 100 58 559 | 5/2002 |
| DE | 100 61 297 | 6/2002 |
| DE | 101 17 663 | 10/2002 |
| DE | 101 20 687 | 10/2002 |
| DE | 101 20 686 | 11/2002 |
| DE | 101 26 859 | 12/2002 |
| DE | 101 26 860 | 12/2002 |
| DE | 101 51 440 | 2/2003 |
| DE | 101 41 440 | 3/2003 |
| DE | 101 53 656 | 5/2003 |
| DE | 101 63 267 | 7/2003 |
| DE | 102 09 400 | 10/2003 |
| DE | 102 12 640 | 10/2003 |
| DE | 102 19 905 | 12/2003 |
| DE | 102 29 168 | 1/2004 |
| DE | 103 41 962 | 4/2004 |
| DE | 699 13 745 | 10/2004 |
| DE | 103 30 064 | 12/2004 |
| DE | 103 30 063 | 2/2005 |
| DE | 103 35 336 | 3/2005 |
| DE | 103 38 277 | 3/2005 |
| DE | 103 40 641 | 4/2005 |
| EP | 0 108 650 | 5/1984 |
| EP | 0 128 529 | 12/1984 |
| EP | 0 268 370 A2 | 5/1988 |
| EP | 0 268 370 A3 | 5/1988 |
| EP | 0 350 179 | 1/1990 |
| EP | 0 418 504 | 3/1991 |
| EP | 0 435 029 | 7/1991 |
| EP | 0 442 123 | 8/1991 |
| EP | 0 460 242 | 12/1991 |
| EP | 0 501 456 A2 | 9/1992 |
| EP | 0 501 456 A3 | 9/1992 |
| EP | 0 511 807 | 11/1992 |
| EP | 0 528 662 | 2/1993 |
| EP | 0 588 721 | 3/1994 |
| EP | 0 603 939 A2 | 6/1994 |
| EP | 0 615 256 | 9/1994 |
| EP | 0 685 985 | 12/1995 |
| EP | 0 716 458 A2 | 6/1996 |
| EP | 0 716 458 A3 | 6/1996 |
| EP | 0 785 578 A2 | 7/1997 |
| EP | 0 785 578 A3 | 7/1997 |
| EP | 0 786 820 | 7/1997 |
| EP | 0 690 457 | 12/1999 |
| EP | 0 962 984 A2 | 12/1999 |
| EP | 0 962 984 A3 | 12/1999 |
| EP | 0 964 516 B1 | 12/1999 |
| EP | 0 966 182 | 12/1999 |
| EP | 0 979 715 | 2/2000 |
| EP | 0 981 165 | 2/2000 |
| EP | 0 989 614 A2 | 3/2000 |
| EP | 1 048 912 | 11/2000 |
| EP | 1 052 594 | 11/2000 |
| EP | 1 065 725 A2 | 1/2001 |
| EP | 1 065 725 A3 | 1/2001 |
| EP | 1 083 775 | 3/2001 |
| EP | 1 102 335 A2 | 5/2001 |
| EP | 1 103 916 | 5/2001 |
| EP | 1 104 035 A2 | 5/2001 |
| EP | 1 113 502 | 7/2001 |
| EP | 1 134 694 | 9/2001 |
| EP | 1 170 851 | 1/2002 |
| EP | 1 215 725 | 6/2002 |
| EP | 1 224 999 | 7/2002 |
| EP | 1 237 207 | 9/2002 |
| EP | 1 251 720 | 10/2002 |
| EP | 1 296 280 | 3/2003 |
| EP | 1 318 084 | 6/2003 |
| EP | 1 383 179 | 1/2004 |
| EP | 1 401 245 | 3/2004 |
| EP | 1 434 281 | 6/2004 |
| FR | 2793089 | 11/2000 |
| GB | 723598 | 2/1955 |
| GB | 2 058 462 | 4/1981 |
| JP | 54069392 | 6/1979 |
| JP | 60117769 | 6/1985 |
| JP | 61001060 | 1/1986 |
| JP | 61167854 | 7/1986 |
| JP | 62065472 A | 3/1987 |
| JP | 362065477 A | 3/1987 |
| JP | 63205943 | 8/1988 |
| JP | 01169942 | 7/1989 |
| JP | 2969184 | 12/1991 |
| JP | 03290976 A | 12/1991 |
| JP | 05152560 | 6/1993 |
| JP | 05259434 | 10/1993 |
| JP | 05347422 | 12/1993 |
| JP | 06-196724 | 7/1994 |
| JP | 08197788 | 8/1995 |
| JP | 09083040 | 3/1997 |
| JP | 09320760 | 12/1997 |
| JP | 10026934 | 1/1998 |
| JP | 11-040708 | 2/1999 |
| JP | 2000-029403 | 1/2000 |
| JP | 2000-173770 | 6/2000 |
| JP | 2001-085272 | 3/2001 |
| JP | 2001-147659 | 5/2001 |
| JP | 2001-267578 | 9/2001 |
| WO | WO 93/16491 | 8/1993 |
| WO | WO 94/17556 | 8/1994 |
| WO | WO 95/06240 | 3/1995 |
| WO | WO 95/31831 | 11/1995 |
| WO | WO 96/02924 | 2/1996 |
| WO | WO 96/19792 | 6/1996 |
| WO | WO 97/12349 | 4/1997 |
| WO | WO 97/18944 | 5/1997 |
| WO | WO 98/18156 | 4/1998 |
| WO | WO 98/18186 | 4/1998 |
| WO | WO 98/40930 | 9/1998 |

| | | |
|---|---|---|
| WO | WO 99/07189 | 2/1999 |
| WO | WO 99/10769 | 3/1999 |
| WO | WO 99/10929 | 3/1999 |
| WO | WO 99/10939 | 3/1999 |
| WO | WO 99/21233 | 4/1999 |
| WO | WO 99/30432 | 6/1999 |
| WO | WO 99/39373 | 8/1999 |
| WO | WO 99/40631 | 8/1999 |
| WO | WO 99/53371 | 10/1999 |
| WO | WO 99/54842 | 10/1999 |
| WO | WO 99/54936 | 10/1999 |
| WO | WO 99/66540 | 12/1999 |
| WO | WO 00/07151 | 2/2000 |
| WO | WO 00/33063 | 6/2000 |
| WO | WO 00/36666 | 6/2000 |
| WO | WO 00/76778 | 12/2000 |
| WO | WO 00/79617 | 12/2000 |
| WO | WO 01/03126 | 1/2001 |
| WO | WO 01/06442 | 1/2001 |
| WO | WO 01/08241 | 2/2001 |
| WO | WO 01/15233 | 3/2001 |
| WO | WO 01/17029 | 3/2001 |
| WO | WO 01/17041 | 3/2001 |
| WO | WO 01/27998 | 4/2001 |
| WO | WO 01/35500 | 5/2001 |
| WO | WO 01/46987 | 6/2001 |
| WO | WO 01/47044 A2 | 6/2001 |
| WO | WO 01/47044 A3 | 6/2001 |
| WO | WO 01/47045 | 6/2001 |
| WO | WO 01/69517 | 9/2001 |
| WO | WO 01/73109 A2 | 10/2001 |
| WO | WO 01/73109 A3 | 10/2001 |
| WO | WO 02/05360 | 1/2002 |
| WO | WO 02/05361 | 1/2002 |
| WO | WO 02/15264 | 2/2002 |
| WO | WO 02/17233 | 2/2002 |
| WO | WO 02/19443 | 3/2002 |
| WO | WO 02/21612 | 3/2002 |
| WO | WO 02/29912 | 4/2002 |
| WO | WO 03/027948 | 4/2002 |
| WO | WO 02/43071 | 5/2002 |
| WO | WO 02/47183 | 6/2002 |
| WO | WO 02/065557 A1 | 8/2002 |
| WO | WO 02/071139 | 9/2002 |
| WO | WO 02/071505 | 9/2002 |
| WO | WO 02/076924 | 10/2002 |
| WO | WO 02/091495 A2 | 11/2002 |
| WO | WO 02/091495 A3 | 11/2002 |
| WO | WO 02/095805 A2 | 11/2002 |
| WO | WO 02/095805 A3 | 11/2002 |
| WO | WO 02/099907 | 12/2002 |
| WO | WO 02/099908 | 12/2002 |
| WO | WO 03/036686 | 5/2003 |
| WO | WO 03/038897 | 5/2003 |
| WO | WO 03/046922 | 6/2003 |
| WO | WO 03/057501 | 7/2003 |
| WO | WO 03/067680 | 8/2003 |
| WO | WO 03/069552 | 8/2003 |
| WO | WO 03/081671 | 10/2003 |
| WO | WO 03/095175 | 11/2003 |
| WO | WO 2004/032257 | 4/2004 |
| WO | WO 2004/042837 A2 | 5/2004 |
| WO | WO 2004/042837 A3 | 5/2004 |
| WO | 2004/047144 | 6/2004 |
| WO | WO 2004/047144 A2 | 6/2004 |
| WO | WO 2004/047144 A3 | 6/2004 |
| WO | WO 2004/047194 A2 | 6/2004 |
| WO | WO 2004/047194 A3 | 6/2004 |
| WO | WO 2004/063806 | 7/2004 |
| WO | WO 2004/068267 | 8/2004 |
| WO | WO 2004/068608 | 8/2004 |
| WO | WO 2004/083859 | 9/2004 |
| WO | 2004/111729 | 12/2004 |
| WO | WO 2004/111729 | 12/2004 |
| WO | WO 2005/004194 | 1/2005 |
| WO | 2005/022664 | 3/2005 |
| WO | WO 2005/022664 | 3/2005 |
| WO | WO 2005/027216 | 3/2005 |

OTHER PUBLICATIONS

Mohr J. et al., "Polymer technologies: a way to low-cost micro-optical components and systems", Proceedings of the SPIE, 2004, vol. 5453, pp. 1-12
Backlund T. G. et al., "Towards all-polymer field-effect transistors with solution processable materials", Synthetic Metals, Elsevier Sequoia, Lausanne, CH, Bol. 148, No. 1, Jan. 3, 2005, pp. 87-91.
Kawase, T. et al., "Inkjet printing of polymer thin film transistors", Preparation and Characterization, Elsevier Sequoia, NL, vol. 438-439, Aug. 22, 2003, pp. 279-287.
Redinger D. et al., "An all-printed passive component technology for low-cost RFID", Device Research Conference, Jun. 23-25, 2003, pp. 187-188.
Subramanian V. et al., "Printed organic transistors for ultra-low cost RFID application", Polymers and Adhesives in Microelectronics and Photonics, 2004. Polytronic 2004, 4th IEEE International conference, Portland, OR, USA, Sep. 12-15, 2004, Piscataway, NJ, USA, IEEE , Sep. 12, 2004, pp. 67-71.
U.S. Appl. No. 10/344,926, filed Feb. 12, 2004, Adolf Bernds et al.
U.S. Appl. No. 10/344,951, filed Feb. 12, 2004, Adolf Bernds et al.
U.S. Appl. No. 10/380,113, filed Sep. 25, 2003, Adolf Bernds et al.
U.S. Appl. No. 10/381,032, filed Feb. 12, 2004, Adolf Bernds et al.
U.S. Appl. No. 10/433,961, filed Apr. 1, 2004, Wolfgang Clemens et al.
U.S. Appl. No. 10/473,050, filed May 20, 2004, Adolf Bernds et al.
U.S. Appl. No. 10/479,234, filed Dec. 30, 2004, Adolf Bernds et al.
U.S. Appl. No. 10/479,238, filed Oct. 20, 2004, Adolf Bernds et al.
U.S. Appl. No. 10/492,922, filed Mar. 3, 2005, Erwann Buillet et al.
U.S. Appl. No. 10/492,923, filed Dec. 23, 2006, Wolfgang Clemens et al.
U.S. Appl. No. 10/508,737, filed May 19, 2005, Adolf Bernds et al.
U.S. Appl. No. 10/517,750, filed Oct. 13, 2005, Wolfgang Clemens et al.
U.S. Appl. No. 10/523,216, filed Feb. 2, 2006, Adolf Bernds et al.
U.S. Appl. No. 10/523,487, filed Apr. 13, 2006, Wolfgang Clemens et al.
U.S. Appl. No. 10/524,646, filed May 11, 2006, Walter Fix et al.
U.S. Appl. No. 10/533,756, filed Jun. 8, 2006, Wolfgang Clemens et al.
U.S. Appl. No. 10/534,678, filed Jun. 8, 2006, Wolfgang Clemens et al.
U.S. Appl. No. 10/535,448, filed Jun. 8, 2006, W. Clemens et al.
U.S. Appl. No. 10/535,449, filed Feb. 16, 2006, Walter Fix et al.
U.S. Appl. No. 10/541,815, filed Jun. 8, 2006, Axel Gerlt et al.
U.S. Appl. No. 10/541,956, filed Jun. 15, 2006, Wolfgang Clemens et al.
U.S. Appl. No. 10/541,957, filed Jul. 6, 2006, Walter Fix et al.
U.S. Appl. No. 10/562,989, filed Jun. 29, 2006, Jurgen Ficker et al.
U.S. Appl. No. 10/562,869, filed Oct. 5, 2006, Wolfram Glauert.
U.S. Appl. No. 10/569,763, filed Aug. 16, 2007, Walter Fix et al.
U.S. Appl. No. 10/568,730, filed Feb. 8, 2007, Wolfgang Clemens et al.
U.S. Appl. No. 10/569,233, filed Jan. 25, 2007, Adolf Bernds et al.
U.S. Appl. No. 10/570,571, filed Jan. 11, 2007, Clemens et al.
U.S. Appl. No. 10/585,775, Walter Fix et al.
U.S. Appl. No. 11/574,139, filed Mar. 13, 2008, Jurgen Ficker et al.
U.S. Appl. No. 11/721,284, Markus Bohm et al.
U.S. Appl. No. 11/721,219, Wolfgang Clemens et al.
U.S. Appl. No. 11/721,244, Robert Blache et al.
U.S. Appl. No. 11/722,457, Markus Bohm et al.
U.S. Appl. No. 11/817,258, Andreas Ullmann et al.
U.S. Appl. No. 11/817,329, Andreas Ullmann et al.
U.S. Appl. No. 11/911,429, Andreas Ullmann et al.
U.S. Appl. No. 11/994,571, Klaus Ludwig et al.
U.S. Appl. No. 11/997,235, Alexander Knobloch et al.
U.S. Appl. No. 11/989,623, Andreas Ullmann et al.

U.S. Appl. No. 12/065,757, Andreas Ullmann et al.

Angelopoulos M et al., "In-Situ Radiation Induced Doping", Mol. Cryst. Liq. Cryst., 1990, vol. 189, pp. 221-225.

Assadi A, et al:, Field-Effect Mobility of Poly (3-Hexylthiophene) Dept. of Physics and Measurement Technology, Mar. 3, 1988; accepted for Publication May 17, 1988.

Backlund, et al, "Towards all-polymer field-effect transistors with solution processable materials", Synthetic Metals, Elsevier Sequoia, Lausanne, CH, vol. 148, No. 1, Jan. 3, 2005, pp. 87-91.

Bao, Z. et al., "High-Performance Plastic Transistors Fabricatecd by Printing Techniques", Chem. Mater vol. 9, No. 6, 1997, pp. 1299-1301.

Bao, Z. et al. "Organic and Polymeric Materials for the Fabrications of Thin Film Field-Effect Transistors", paper presented at the meeting of American Chemical Society, Division of Polymer Chemistry, XX, XX, vol. 39, No. 1, Mar. 29, 1998.

Baude P F et al, "Organic semiconductor RFID transponders" International Electron Devices Meeting 2003. IEDM. Technical Digest. Washington, DC, Dec. 8-10, 2003, New York NY, IEEE, US Dec. 8, 2003, pp. 191-194.

Becker, Eike, et al., "A New Structuring Technique for Polymer Integrated Circuits", Institut fur Hochfrequenztechnik, TU Braunschweit, Germany, Session 4: Polymer Electronic Devices II, pp. 95-97.

Belloni, F. et al, "Parameters Optimization for Improved Dynamics of Voltage Multipliers for Space", 2004 $35^{th}$ Annual IEEE Electronics Specialists Conference, Aachen, Germany, 2004, pp. 439-442.

Bonse M. et al., "Integrated a-Si:H/Pentacene Inorganic Organic Complementary Circuits" in IEEE, IEDM 98, pp. 249-252.

Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.

Brabec, C.J. et al., "Photovoltaic properties of a conjugated polymer/methanofullerene composites embedded in a polystyrene matrix", Journal of Applied Physics, vol. 85, No. 9, 1999, pp. 6866-6872.

Braun D., et al, "Visible light emission from semiconducting polymer diodes", American Institute of Physics, Applied Physics Letters 58, May 6, 1991, pp. 1982-984.

Brown, A.R. et al., "Field-effect transistors made from solution-processed organic semiconductors", Elsevier Science, S.A., Synthetic Metals 88 (1997) pp. 37-55.

Brown, A.R., "Logic Gates Made from Polymer Transistors and Their Use in Ring Oscillators", Science, vol. 270, Nov. 10, 1995, pp. 972-974.

Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, vol. 43, No. 9, Sep. 1996.

Chen, X.L. et al., "Morphological and Transistor Studies of Organic Molecular Semiconductors with Anisotropic Electrical Characteristics", American Chemical Society, 2001, Chem. Mater. 2001, 13, 1341-1348.

Clemens, W. et al., "Vom Organischen Transistor Zum Plastik-Chip," Physik Journal, V. 2, 2003, pp. 31-36.

Collet J. et al:, 'Low Voltage, 30 NM Channel Length, Organic Transistors With a Self-Assembled Monolayer As Gate Insulating Films:, Applied Physics Letters, American Institute of Physics. New York, US, Bd 76, Nr. 14, Apr. 3, 2000, Seiten 1941-1943, XP000950589, ISSN:0003-6951, das ganze Dokument.

Cox, Robert W. et al., "A Minimally Intrusive, Low Cost System for Determining Indoor Air Flow Patterns", Computers in Power Electronics, 2004. IEEE Workshop on Urbana, IL Aug. 15-18, 2004, Piscataway, NJ, IEEE, Aug. 15, 2004, pp. 63-68.

Crone, B. et al, "Large-scale complementary Integrated circuits based on Organic transistors", Nature, vol. 403, Feb. 3, 2000, pp. 521.

Crone B. K. et al., "Design and Fabrication of Organic Complementary Circuits", J. Appl. Phys. vol. 89, May 2001, pp. 5125-5132.

Dai, L. et al, Photochemical Generation of Conducting Pattersn in Polybutadiene Films:, Macromolecules, vol. 29, No. 1, 1996, pp. 282-287, XP 001042019, the whole document.

Dai, L. et al., "Conjugation of Polydienes by Oxidants Other Than Iodine", Elsevier Science S.A., Synthetic Metals 86 (1997) 1893-1894.

Dai, L. et al., "$I_2$-Doping" of 1,4-Polydienes*, Elsevier Science S.A., Synthetic Metals 69 (1995), pp. 563-566.

De Leeuw C.M. et al., "Polymeric integrated circuits and light-emitting diodes", Electron Devices Meeting, 1997. Technical Digest, International, Washington, DC, USA Dec. 7-10, 1997, New York, NY, USA, IEEE, US Dec. 7, 1997.

Dodabalapur, A. et al., Organic smart pixels, American Institute of Physics, Applied Physics Letters, vol. 73, No. 2, Jul. 13, 1998, pp. 142-144.

Drury et al., "Low-Cost All-Polymer Integrated Circuits", American Institute of Physics, Applied Physics Letters, 1998, vol. 73, No. 1, pp. 108-110, Jul. 6, 1998.

Ficker, J. et al., "Dynamic and Lifetime Measurements of Polymer OFETS and Integrated Plastic Circuits, " Proc. of SPIE, v. 466, 2001, pp. 95-102.

Fix, W. et al., "Fast Polymer Integrated Circuits Based on a Polyfluorene Derivative", ESSDERC 2002, 2002, pp. 527-529.

Fix, W., et al., "Fast polymer integrated circuits", American Institute of Physics, Applied Physics Letters, vol. 81, No. 89, Aug. 2002, pp. 1735-1737.

Forrest et al.: "The Dawn of Organic Electronics", IEEE Spectrum, Aug. 2000, Seiten 29-34, XP002189000, IEEE Inc., New York, US ISSN:0018-9235, Seite 33, rechte Spalte, Zelle 58-Seite 34, linke Spalte, Zeile 24; Abbildung 5.

Fraunhofer Magazin- Polytronic Chips Von der Rolle, 4.2001, pp. 8-13.

Garbassi F., et al., "Bulk Modifications", Polymer Surfaces, John Wiley & Sons, 1998, pp. 289-300.

Garnier F et al:, "Vertical Devices Architecture by Molding Of Organic-Based Thin Film Transistor", Applied Physics Letters, American Institute of Physics. XP000784120, issn: 0003-6951 abbildung 2.

Garnier, F. et al, "All-Polymer Field-Effect Transistor Realized by Printing Techniques", Science, American Association for the Advancement of Science, US, vol. 265, Sep. 16, 1994, pp. 1684-1686.

Garnier et al., "Conjugated Polymers and Oligomers as Active Material for Electronic Devices", Synthetic Metals, vol. 28, 1989.

Gelinck, G.H. et al., "High-Performance All-Polymer Integrated Circuits", Applied Physics Letters, v. 77, 2000, pp. 1487-1489.

Goncalves_Conto, Sylvie, et al., "Interface Morphology in Organic Light-Emitting Diodes", Advanced Materials 1999, vol. 11, No. 2, pp. 112-115.

Gosain, D.P., "Excimer laser crystallized poly-Si TFT's on plastic substrates", Second International Symposium on Laser Precision Microfabrication, May 16-18, 2001, Singapore, vol. 4426, pp. 394-400.

Halls, J.J. M., et al., "Efficient photodiodes from interpenetrating polymer networks", Nature, vol. 376, Aug. 10, 1995, pp. 498-500.

Harsanyi G. et al, "Polytronics for biogtronics:unique possibilities of polymers in biosensors and BioMEMS", IEEE Polytronic 2002 Conference, Jun. 23, 2002, pp. 211-215.

Hart, C.M. et al, "Low-cost all-polymer integrated circuits", Solid-State Circuits Conference, 1998. EXXCIRC '98 Proceedings of the $24^{th}$ European, The Hague, The Netherlands Sep. 22-24, 1998, Piscataway, NJ, USA, IEEE, Sep. 22, 1998, pp. 30-34.

Hebner, T.R. et al., Ink-jet printing of doped polymers for organic light emitting devices:, American Institute of Physics, Applied Physics Letters, vol. 72, No. 5, Feb. 2, 1998, pp. 519-521.

Hergel, H. J.: "Pld-Programmiertechnologien", Elektronik, Franzis Verlag GMBH. Munchen, DE, Bd 41, Nr. 5, Mar. 3, 1992, Seiten 44-46, XP000293121, ISSN: 0013-5658, Abbildungen 1-3.

Hofstraat, Hans, "Will Polymer Electronics Change the Electronics Industry?", Philips Research, Keynote Session, Department Polymers & Organic Chemistry and University of Amsterdam, The Netherlands, 2001.

Hwang J D et al:, "A Vertical Submicron Slc thin film transistor", Solid State Electronics, Elsevier Science Publishers, Barking, GB, Bd. 38, NR. 2, Feb. 1, 1995, Seiten 275-278, XP004014040, ISSN:0038-1101, Abbildung 2.

IBM Technical Disclosure Bulletin, "Short-Channel Field-Effect Transistor", IBM Corp., New York, US, Bd. 32, Nr. 3A, Aug. 1, 1989 Seiten 77-78, XP000049357, ISSN:0018-8689, das ganze Dokument.

Ishiwara, Hiroshi, "Current Status and Prosepcts of Ferroelectric Memories", Frontier Collaborative Research Center, Tokyo Institute of Technology, Yokohama, Japan, IEDM 725-728.

Kamba, S. et al., "Dielectric dispersion of the relaxor PLZT ceramics in the frequency rangee 20Hz-100 THz", J. Phys.: Condens. Matter 12 (2000), pp. 497-519.

Kawase, T., et al., "Inkjet Printed Via-Hole Interconnections and Resistors for All-Polymer Transistor Circuits", Advanced Materials 2001, 13, No. 21, Nov. 2, 2001, pp. 1601-1605.

Kawase, T. et al., "Inkjet printing of polymer thin film transistors", Thin Solid Films 438-439 (2003) 279-287.

Kind, D., "Einfuhrung in die Hochspannungs-Versuchstechnik", Friedrich. Vieweg & Sohn, Braunschweig/Wiesbaden, pp. 16-21.

Klauk, H. et al., "Fast Organic Thin Film Transistor Circuits", IEEE Electron Device Letters, vol. 20, No. 6, pp. 289-291.

Klauk, H. et al., "Pentacene Thin Film Transistors and Inverter Circuits", 1997 International Exectron Devices Meeting Technical Digest, pp. 539-542, Dec. 1997.

Kleim, Herbert et al., "Dielectric Permittivity of $Si_3N$ and $SiO_4$, Increased by Electrode Profile and Material", 1999 Conference on Electrical Insulation and Dielectric Phenomena.

Knobloch, A. et al., "Printed Polymer Transistors", Proc. Polytronic, v. 84, 2001, pp. 84-89.

Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.

Koezuka, H. et al., "Macromolecular Electronic Device", Mol. Cryst. Liq. Cryst. 1994, vol. 2555, pp. 221-230.

Kuhlmann et al., "Terabytes in Plastikfolie", Organische Massenspeicher vor der Serienproduktion.

Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.

Kymissis, Ioannis, et al., "High-Performance Bottom Electrode Organic Thin-Film Transistors", IEEE Transactions on Electron Devices, vol. 48, No. 6, Jun. 2001, pp. 1060-1064.

Lidzey, D. G. et al., "Photoprocessed and Micropatterned Conjugated Polymer LEDs", Synthetic Metals, V. 82, 1996, pp. 141-148.

Lowe, J. et al., "Poly (3—(2—Acetoxyethyl)Thiophene): A Model Polymer for Acid-Catalyzed Lithography", Synthetic Metals, Elsevier Sequoia, Lausanne, CH, Bd. 85, 1997, Seiten 1427-1430.

Lu, Wen et al., "Use of Ionic Liquids for π-Conjugated Polymer Electrochemical Devices", Science, vol. 297, 2002, pp. 983-987.

Lucent Technologies, "Innovation marks significant milestone in the development of electronic paper", Cambridge, MA and Murray Hill, NJ, Nov. 20, 2000. XP-002209726.

Manuelli, Alessandro et al., "Applicability of Coating Techniques for the Production of Organic Field Effect Transistors", IEEE Polytronic 2002 Conference, 2002, pp. 201-204.

Marko, H., Vorlesungsmanuskript "Nachrichtentechnik 2 (Modulationsverfahren" des Lehrstuhls fur Nachrichtentechnik der Technischen Universitat Munchen, 1989.

Miyamoto, Shoichi et al:, Effect of LDD Structure and Channel Poly-Si Thinning on a Gate-All-Around TFT (GAT) for SRAM's, IEEE Transactions on Electron Devices. vol. 46, No. 8, Aug. 1999.

Nalwa, H.S., "Organic Conductive Molecules and Polymers", vol, 2, 1997, pp. 534-535.

Oelkrug, O. et al., "Electronic spectra of self-organized oligothiophene films with 'standing' and 'lying' molecular units", Elsevier Science S.A., 1996, Thin Solid Films 284-270.

"New Plastic Circuits are Flexible Enough to be Folded in Half", Internet Citation, (On line) Dec. 8, 1997, pp. 1-3, www.research.philips.com/pressmedia/releases/97005E.html.

Prosandeev. S.A., et al., "Characteristics and the nature of the low-frequency dielectric response in moderately concentrated KTaO3:li", Institute of Physics Publishing, Journal of Physics; Condensed Matter 13 (2001) pp. 9749-9760.

Qiao, X. et al., "The FeCl3-doped poly3-alkithiophenes) in solid state", Elsevier Science, Synthetic Metals 122 (2001) pp. 449-454.

Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.

Redinger, David et al., "An all-printed passive component technology for low-cost RFID", Device Research Conference, Jun. 23, 2003, pp. 187-188.

Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN 003-6951, das ganze Dokument.

Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11, Nr. 9, Jul. 5, 1999, Seiten 741-745, P000851834, ISSN: 0935-9648, das ganze Dokument.

Rogers, J.A. et al., "Organic Smart Pixels and Complementary Inverter Circuits Formed on Plastic Substrates by Casting and Rubber Stamping", IEEE Electron Devices Letters, vol. 21, No. 3, Mar. 2000, pp. 100-103.

Roman et al., "Polymer Diodes With High Rectification", Applied Physics Letters, vol. 75, No. 21, Nov. 22, 1999.

Rost, Henning et al., "All-Polymer Organic Field Effect Transistors", Proc. Mat. Week, CD, 2001, pp. 1-6.

Sandberg, H. et al, "Ultra-thin Organic Films for Field Effect Transistors", SPIE vol. 4466, 2001, pp. 35-43.

Schoebel, "Frequency Conversion with Organic-On-Inorganic Heterostructured Diodes", Extended Abstracts of the International Conference on Solid State Devices and Materials, Sep. 1, 1997.

Schrodner M. et al., "Plastic electronics based on Semiconducting Polymers", First International IEEE Conference on Polymers and Adhesives in Microelectronics and Photonics. Incorporating Poly, Pep & Adhesives in Electronics. Proceedings (Cat. No. 01TH8592), First International IEEE Conference on Polymers and Adhesives in Micr, Seitenn 91-94.

Sirringhaus H., et al, "High Resolution Inkjet Printing of All-Polymer Transistor Circuits", Science, vol. 290, Dec. 15, 2000, pp. 2123-2126.

Speakman, S.P. et al., High performance organic semiconducting thin films: Ink Jet printed polythophene [rr-P3HT], Organic Electronics 2 (2), 2001, pp. 65-73.

Subramanian, V.. et al., "Printed Organic Transistors for Ultra-low-cost RFID Applications", Polymers and Adhesives in Microelectronics and Photonics, 2004, Polytronic 2004. 4th IEEE International Conference, Portland, OR, USA, Sep. 12-15, 2004, Piscataway, NJ, pp. 67-71.

Ullman, A. et al., "High Performance Organic Field-Effect Transistors and Integrated Inverters", Mat. Res. Soc. Symp. Proc., v. 665, 2001, pp. 265-270.

Wang, Yading et al., "Electrically Conductive Semiinterpenetrating Polymer Networks of Poly(3-octylthiophene)", Macromolecules 1992, vol. 25, pp. 3284-3290.

Weiss, Ray, "Flash Memory Takes Over", Electronic Design Online ID#3756, Aug. 20, 2001.

Yasufuko, Sachio et al., "Dielectric and Thermoanalytical Behaviour of Moisture and Water in Aromatic Polyamide and Polymide Films", Conference Record of the 1994 IEEE International Symposium on Electrical Insulation, Pittsburgh, PA, USA, Jun. 5-8, 1994.

Yu, G. et al., "Dual-function semiconducting polymer devices: Light-emitting and photodetecting diodes", American Institute of Physics, Applied Physics Letter 64, Mar. 21, 1994, pp. 1540-1542.

Zangara L., "Metall Statt Halbleiter, Programmierung Von Embedded ROMS Ueber Die Metallisierungen", Elektronik, Franzis Verlag GmbH, Munchen, DE, vol. 47, No. 16, Aug. 4, 1998, pp. 52-55.

Zheng, Xiang-Yang et al., "Electrochemical Patterning of the Surface of Insulators with Electrically Conductive Polymers", J. Electrochem. Soc., v. 142, 1995, pp. L226-L227.

Shaheen, S.E., et al., "Low band-gap polymeric photovoltaic devices", Synthetic Metals, vol. 121, 2001, pp. 1583-1584.

Takashima, W. et al., Electroplasticity Memory Devices Using Conducting Polymers and Solid Polymer Electrolytes, Polymer International, Melbourne, 1992, pp. 249-253.

Velu, G. et al. "Low Driving Voltages and Memory Effect in Organic Thin-Film Transistors With A Ferroelectric Gate Insulator", Applied Physics Letters, American Institute of Physics, New York, vol. 79, No. 5, 2001, pp. 659-661.

Wang, Hsing et al., "Conducting Polymer Blends: Polythiophene and Polypyrrole Blends with Polystyrene and Poly(bisphenol A carbonate)", Macromolecules, 1990, vol. 23, pp. 1053-1059.

Zie Voor Titel Boek, d 2e Pagina,XP-002189001, p. 196-228.

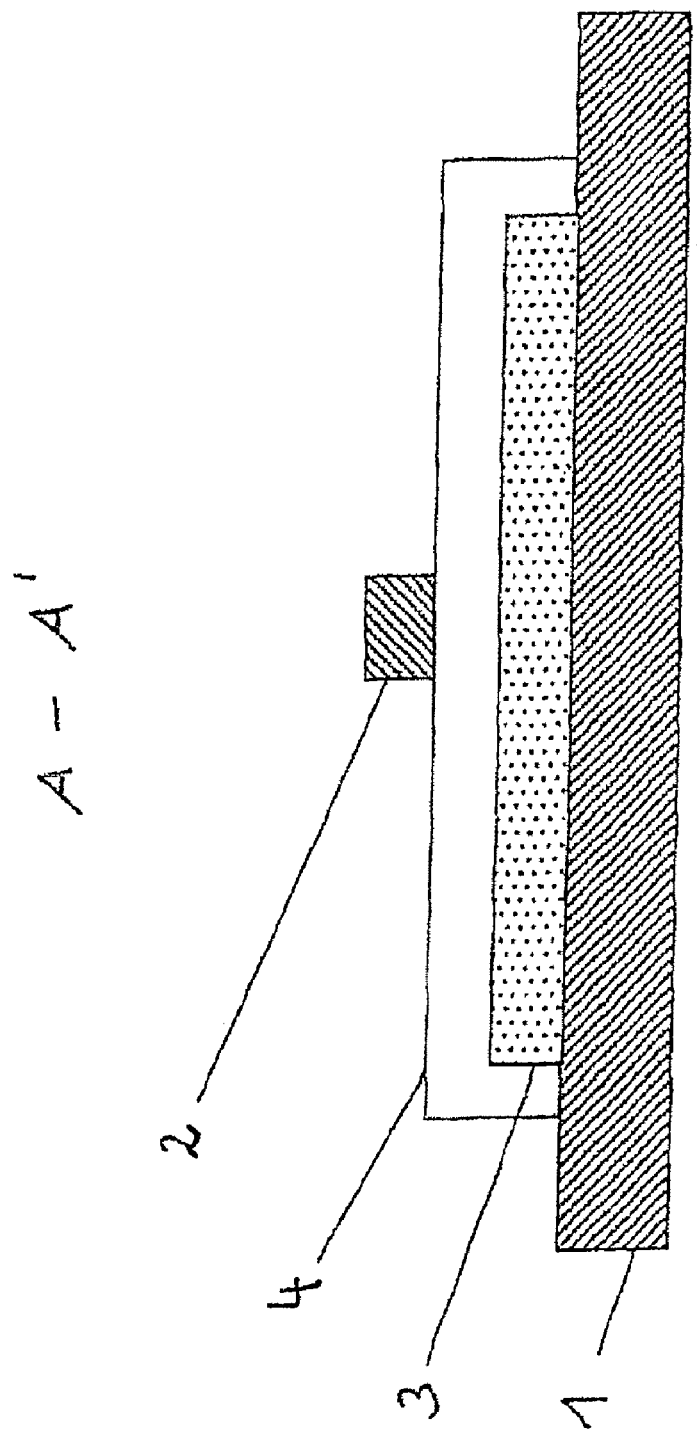

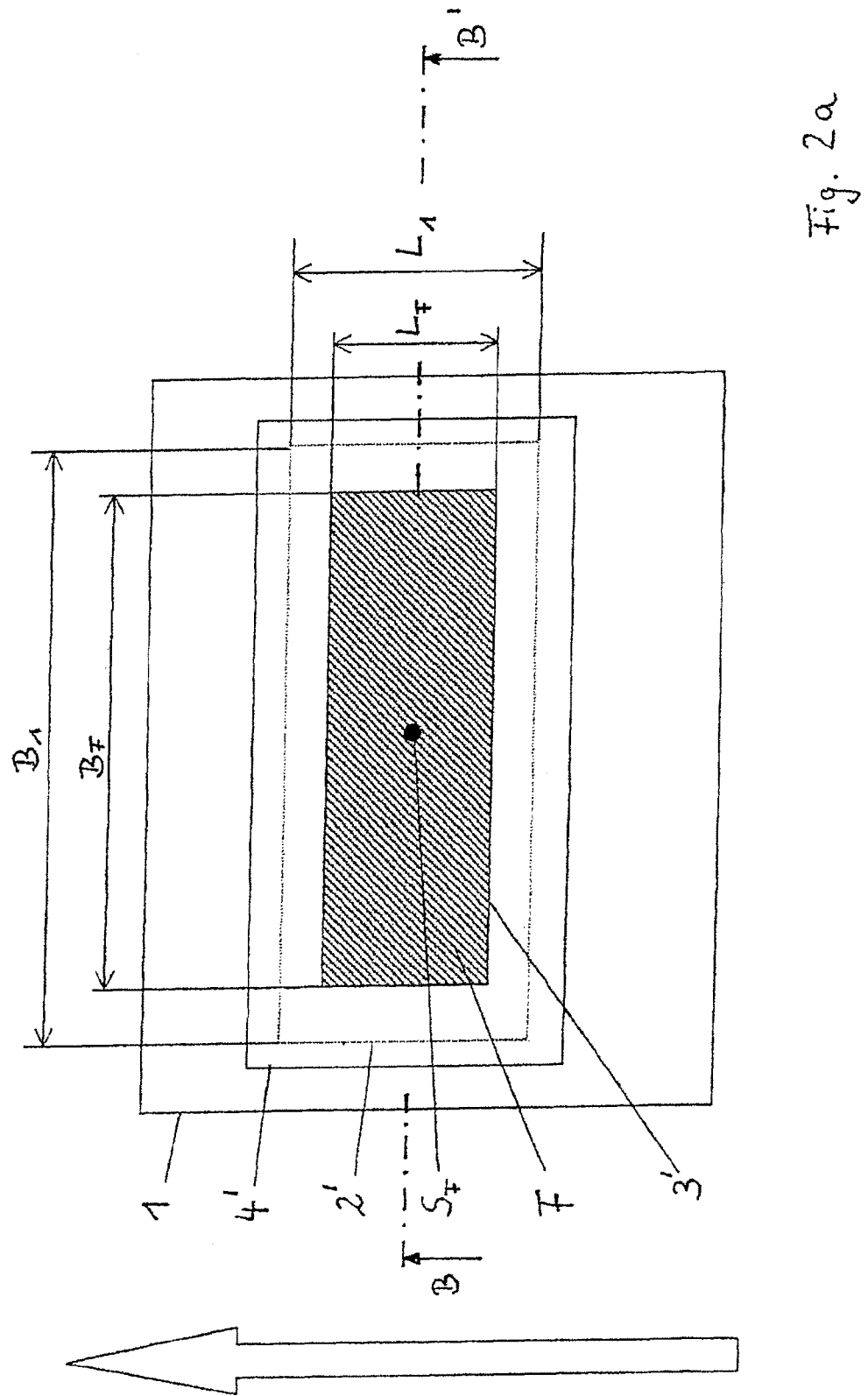

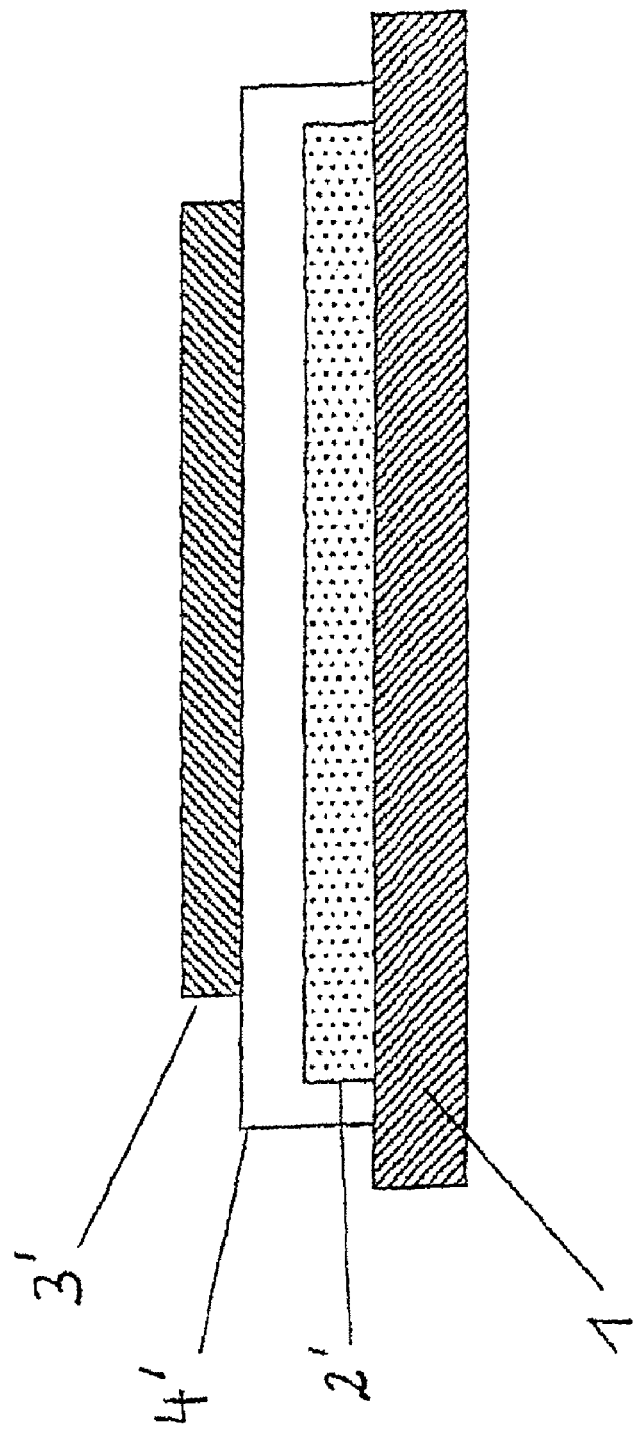

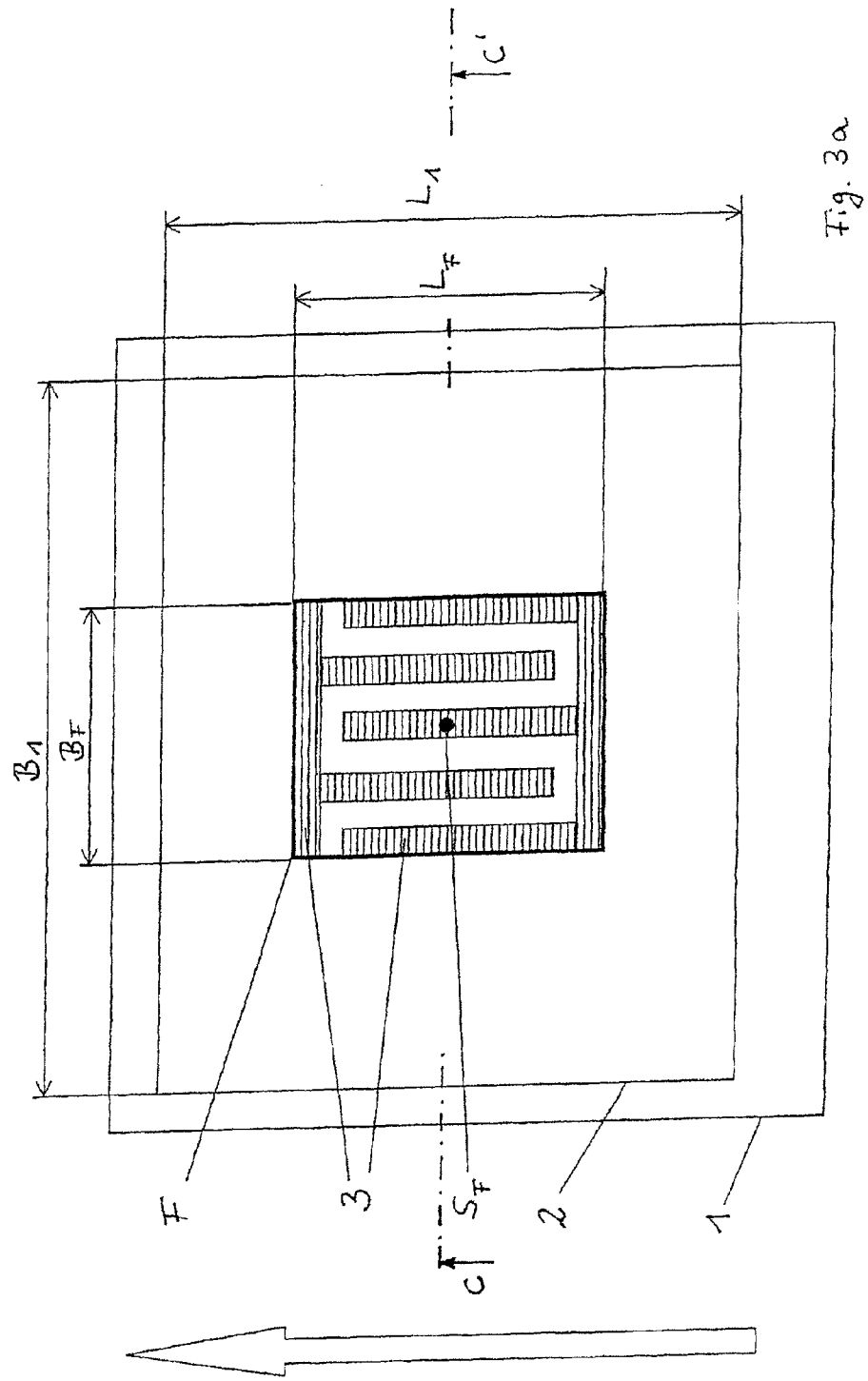

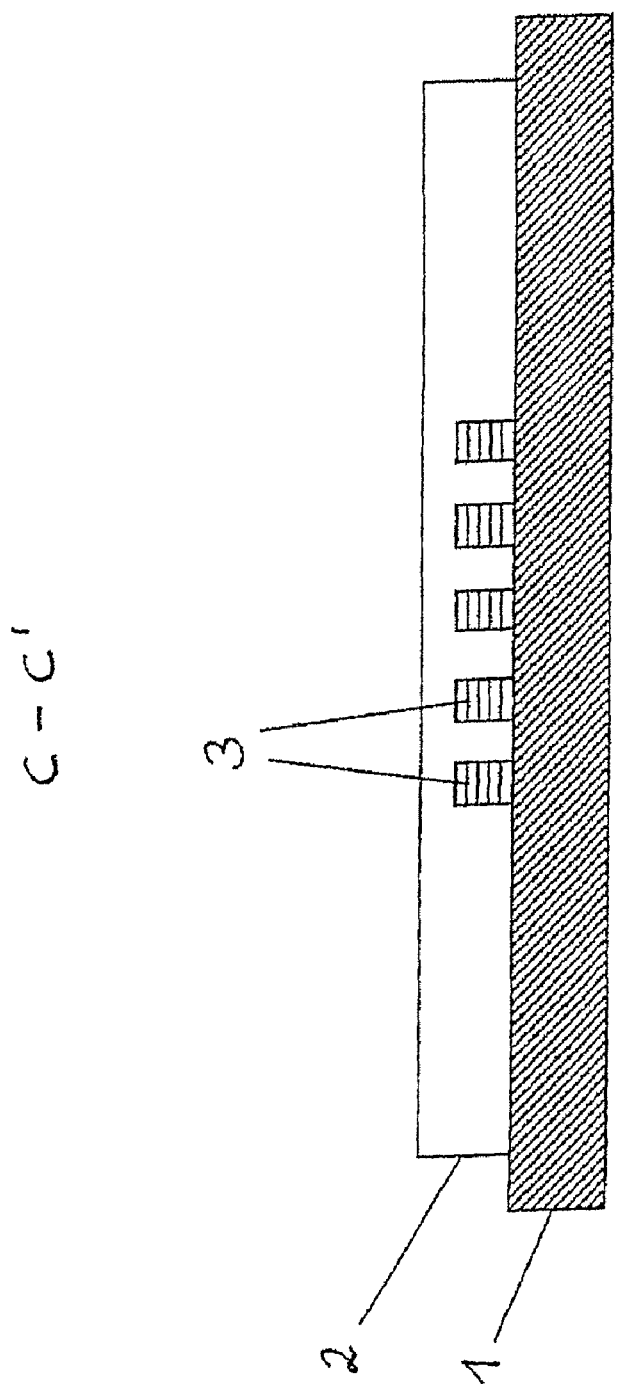

METHOD FOR PRODUCING AN ELECTRONIC COMPONENT

The invention relates to a method for producing an electronic component on a surface of a substrate with the electronic component having, seen at right angles to the surface of the substrate, at least two electrical functional layers which are arranged one above the other and such that they overlap at least in a surface area F, with the at least two electrical functional layers on the substrate being structured directly or indirectly using a continuous process, and with the substrate being moved relative to a structuring unit.

One such method is known from WO 2004/047144 A2. An organic electronic component is described, such as an organic field-effect transistor (OFET), circuits with components such as these, and a production method. The electronic component is formed using a low-cost printing process.

DE 101 26 859 A1 describes a method for producing conductive structures, active components produced in this way such as organic field-effect transistors (OFETs) or organic light-emitting diodes (OLEDs) as well as circuits with components such as these. The conductive structure such as interconnects and electrodes are produced by means of printing techniques on a thin, flexible plastic film, with all known printing processes, in particular intaglio, relief, lithography, screen printing or tampo printing, being cited as being suitable.

The use of continuous processes for the production of electronic components allows them to be mass-produced at low cost at high process rates. In order to achieve electrical values that are as uniform as possible and the functionality of an electronic component, the individual electrical functional layers from which the electronic component is constructed must be formed successively and, in the process, in a correct position, orientation and arrangement one above the other, in accordance with a predetermined layout. The higher the speed that is chosen for the substrate and/or the structuring unit in the continuous process, the more probable is the occurrence of discrepancies in the area of the ideal positioning of the electrical functional layers with respect to further electrical functional layers which have already been provided on the substrate.

Direct formation and simultaneous structuring of the electrical functional layer are preferably carried out by means of a printing process. Alternatively, however, an electrical functional layer can also be structured by means of a laser or etching technique only after its formation. In both cases, a proportion of the area of the electrical functional layer is not formed at the ideal position, as predetermined by the layout, because of the process.

The object of the invention is now to provide a method for producing an electronic component which, even at high process rates, leads to a functional, electronic component with the desired electrical characteristic values.

For the method for producing an electronic component on a surface of a substrate, with the electronic component having, seen at right angles to the surface of the substrate, at least two electrical functional layers which are arranged one above the other and such that they overlap at least in a surface area F, with the at least two electrical functional layers on the substrate being structured directly or indirectly using a continuous process, and with the substrate being moved relative to a structuring unit, the object is achieved in that a) a first electrical functional layer of the at least two electrical functional layers is structured such that a first length dimension ($L_1$) of the first electrical functional layer parallel to the surface of the substrate and in a relative movement direction of the substrate relative to the structuring unit is at least 5 μm longer, preferably more than 1 mm longer, than a length dimension ($L_F$) of the surface area F in the relative movement direction and parallel to the surface of the substrate, and/or in that b) a first electrical functional layer of the at least two electrical functional layers is structured such that a first width dimension ($B_1$) of the first electrical functional layer parallel to the surface of the substrate and at right angles to a relative movement direction of the substrate is at least 5 μm wider, and preferably more than 1 mm wider relative to the structuring unit than a width dimension ($B_F$) of the surface area F at right angles to the relative movement direction and parallel to the surface of the substrate.

Any electrical lines or interconnects which are required to make electrical contact with the electrical functional layers are in this case considered as not being associated with the respective functional layer.

If the substrate is moved relative to the structuring unit, then this means that either the substrate itself and/or the structuring unit can be moved. In this case, either only the substrate may be moved with the structuring unit remaining stationary during this process, or the structuring unit can move with the substrate remaining stationary in this case, or else both the substrate and the structuring unit may be moveable.

The method according to the invention makes it possible to position with extremely little effort a further electrical functional layer, which is intended to be formed after the formation of a first electrical functional layer designed in this way and to be aligned with respect to the first electrical functional layer, since any minor discrepancy from the ideal positioning of the further electrical functional layer does not affect the functionality and the electrical characteristic values of the electronic component. An electronic component formed using the method according to the invention accordingly tolerates (in the relative movement direction and/or at right angles to the relative movement direction) a discrepancy from the layout in the positioning of the first electrical functional layer with respect to a further electrical functional layer, depending on the location of the ideal position of the first electrical functional layer with respect to the surface area F. This allows the process rate to be increased further and the probability of occurrence of defective electronic components to be reduced.

In this case, it is particularly preferable for the first length dimension of the first electrical functional layer in the relative movement direction to be 50 to 500 μm longer than the length dimension of the surface area F in the relative movement direction. This design represents a compromise between the additional space required by the method for the electrical functional layers and the probability of achieving a component which does not operate, or operates only to a restricted extent.

It has been proven, for the first electrical functional layer to be positioned with respect to the surface area F such that a first area centroid of the first electrical functional layer and an area centroid of the surface area F are located one above the other in the layout, seen at right angles to the surface of the substrate. In consequence, in case a) according to the layout, the first electrical functional layer overhangs the surface area F in the relative movement direction both at the front and at the rear, so that an area centroid of a further electrical functional layer can be positioned in accordance with the layout in the relative movement direction both with a negative and with a positive discrepancy from its ideal position. In case b), the first electrical functional layer, in accordance with the layout, overhangs the surface area F at right angles to the relative movement direction on both sides, so that an area centroid of a further electrical functional layer can be positioned at right angles to the relative movement direction both with a negative and with a positive lateral discrepancy from its ideal position, in accordance with the layout.

If only case a) occurs, then it is also possible instead of this to combine case a) with case b) such that a second electrical functional layer of the at least two electrical functional layers to be structured such that a second width dimension of the second electrical functional layer parallel to the surface of the substrate and at right angles to the relative movement direction is at least 5 μm wider, preferably more than 1 mm wider, than a width dimension of the surface area F at right angles to the relative movement direction and parallel to the surface of the substrate. This likewise ensures that different positioning of the substrate on the plane of the substrate seen at right angles to the relative movement direction can be tolerated to a major extent when the first and second electrical functional layers are formed successively.

In this case, it has been proven for the second electrical functional layer to be positioned with respect to the surface area F in the layout such that a second area centroid of the second electrical functional layer and the area centroid of the surface area F will be located one above the other, seen at right angles to the surface of the substrate. In consequence, the second electrical functional layer in the layout overhangs the surface area F in the relative movement direction on both sides, so that, in the relative movement direction, any lateral discrepancy, which may occur during printing, of the second electrical functional layer from the ideal position in accordance with the layout can be tolerated.

It has been proven that a printing process, such as intaglio, relief, lithographic, screen or tampo printing processes may be used as the continuous process. The expression screen printing should in this case be understood as also covering template printing.

Printing methods such as these can be carried out at high process rates. In this case, an electrical functional layer may be formed on the substrate directly by means of printing and in the desired form at this stage.

It has also been proven that a laser structuring method or a photolithographic structuring method can be used as a continuous process, with the expression photolithographic structuring method in this case being used in general to mean all etching methods which make use of masks or masking layers.

Methods such as these allow the indirect formation and shaping of an electrical functional layer which has been formed on the substrate, for example by means of vapor deposition or sputtering. In this case, for example a vapor-deposited electrical functional layer is removed in places by means of a laser. During the positioning of the laser with respect to the electrical functional layer which has already been formed on the substrate, minor discrepancies from the ideal position normally occur, so that this results in a discrepancy between the electrical functional layer that is formed and the layout.

If a photo resist is applied over the entire area of an electrical functional layer, it is exposed via a mask, and the areas of the resist that have not been cured are removed, an etching process is carried out and the photo resist is then removed, then minor discrepancies in the positioning of the mask from its ideal position also result in position discrepancies between the electrical functional layer that is formed and the layout.

Furthermore, the electrical functional layer may actually be printed in the desired areas for example with an etching-resistant mask layer, with those areas of the electrical functional layer which have not been printed being removed by etching. The etching-resistant mask layer is then dissolved and those areas of the electrical functional layer which have been structured in the desired shape and remain underneath are exposed. As in the situation when an electrical functional layer is printed directly, discrepancies from the ideal position likewise occur during printing of the mask layer. These are transferred directly from the mask layer to the electrical functional layer that has been structured in this way.

Furthermore, it has been proven that an ink-jet structuring process can be used as the continuous process, with high process rates being possible. In this case, an electrical functional layer may be formed on the substrate directly by means of ink-jet printing and in the desired form at this stage. The ink-jet process, however, also makes it possible to apply a mask layer in order to structure a previously formed electrical functional layer in this way.

The relative speed of the substrate with respect to the structuring unit during the continuous process is preferably chosen to be in the range from 0.5 to 200 m/min, preferably in the range from 10 to 100 m/min. This allows mass production of electronic components with low production costs.

In this case, it is particularly preferable for a flexible substrate, in particular an elongated plastic film which may have more than one layer, to be used as the substrate. By way of example, plastic films composed of polyester, polyethylene, polyethylene-terephthalate or polyimide are suitable for this purpose.

It has been proven that the thickness of the substrate may be chosen in the range from 6 μm to 200 μm, preferably in the range from 12 μm to 50 μm.

In the case of a flexible substrate is particularly advantageous when transport from roll to roll is carried out during the continuous process. In this case, the uncoated flexible substrate is wound up onto one roll, the substrate is pulled off the roll and is passed through a process machine, during which process it is structured, and is finally wound up on a further roll, as a coated substrate. This allows the processing of long substrate strips, in which case the positioning process with respect to the process machine need be carried out only once at the start of a new substrate roll.

It has been proven that the at least two electrical functional layers may each be formed with a layer thickness in the range from 1 nm to 100 μm, preferably in the range from 10 nm to 300 nm.

The at least two electrical functional layers may be arranged directly adjacent to one another in the electronic component, seen in the cross section through the substrate. The at least two electrical functional layers therefore make direct contact with one another.

Alternatively, at least one third electrical functional layer may be arranged at least in the surface area F in the electronic component between the at least two electrical functional layers, seen in the cross section through the substrate. The at least two electrical functional layers therefore do not make direct contact with one another.

In this case, it has been proven that the at least one third electrical functional layer may overhang the surface area F on all sides, seen at right angles to the surface of the substrate, with a third length dimension of the at least one third electrical functional layer parallel to the surface of the substrate and in the relative movement direction being at least 5 μm longer, preferably more than 1 mm longer, than the length dimension of the surface area F in the relative movement direction and parallel to the surface of the substrate and with a third width dimension of the third electrical functional layer parallel to the surface of the substrate and at right angles to the relative movement direction being at least 5 µm wider, preferably more than 1 mm wider, than a width dimension of the surface area F at right angles to the relative movement direction and parallel to the surface of the substrate.

The first electrical functional layer is preferably in the form of one or more, in particular organic, electrode or electrodes.

In this case, all types of organic, metallo-organic and inorganic plastics may be viewed as conductive "organic" materials. There is accordingly no intention to restrict this in the dogmatic sense to organic material as being a material containing carbon, and, in fact, this is also intended to cover the use, for example, of silicones. Furthermore, the expression is not intended to be restricted in any way in terms of the molecule size, in particular to polymer and/or oligomer materials, and the use of "small molecules" is also possible in all cases.

Polyaniline or polypyrrole have been proven, inter alia, as electrically conductive organic materials.

However, vapor-deposited or sputtered metal layers are also suitable as an electrode layer for the first electrical functional layer, for example composed of at least one of the materials gold, silver, copper, aluminum, platinum, titanium or the like. These are then preferably structured by means of a laser or etching.

If the second electrical functional layer makes direct contact with the first electrical functional layer, then it has been proven that the second electrical functional layer may be in the form of an electrical, in particular organic, isolation layer or a semiconductor layer, in particular an organic semiconductor layer. Inter alia, polyvinyl phenol has been proven as an organic isolation material. By way of example, polythiophene is suitable for use as an organic semiconductor material.

If the first and the second electrical functional layers are arranged at a distance from one another, then it has been proven that the second electrical functional layer may be in the form one or more, in particular organic, electrode or electrodes. In this case, the materials already mentioned above for the first electrical functional layer, which is in the form of an electrode, can likewise be used as electrically conductive materials.

A field-effect transistor, a capacitor, a diode or a component having at least one via in particular in each case with at least one organic electrical functional layer, is preferably formed as the electronic component. The expression via means an opening, normally at right angles to the substrate plane, through which an electrical connection is made between electrical functional layers, which do not make direct contact with one another, in a functional layer stack. The process of forming vias, for example by means of an etching process and using a structuring layer, can also result in offsets of the type described above, in which case any discrepancy in the position of a via from the ideal position in accordance with the layout can be compensated for by means of the method according to the invention.

FIGS. 1a to 3b are intended to explain the invention by way of example. In these figures:

FIG. 1a shows a plan view of a coated substrate,

FIG. 1b shows a cross section A-A' through the coated substrate shown in FIG. 1a, FIG. 2a shows a plan view of a further coated substrate, FIG. 2b shows a cross section B-B' through the coated substrate shown in FIG. 2a, FIG. 3a shows a plan view of a further coated substrate, and FIG. 3b shows a cross section C-C' through the coated substrate shown in FIG. 3a.

Figure 1A:
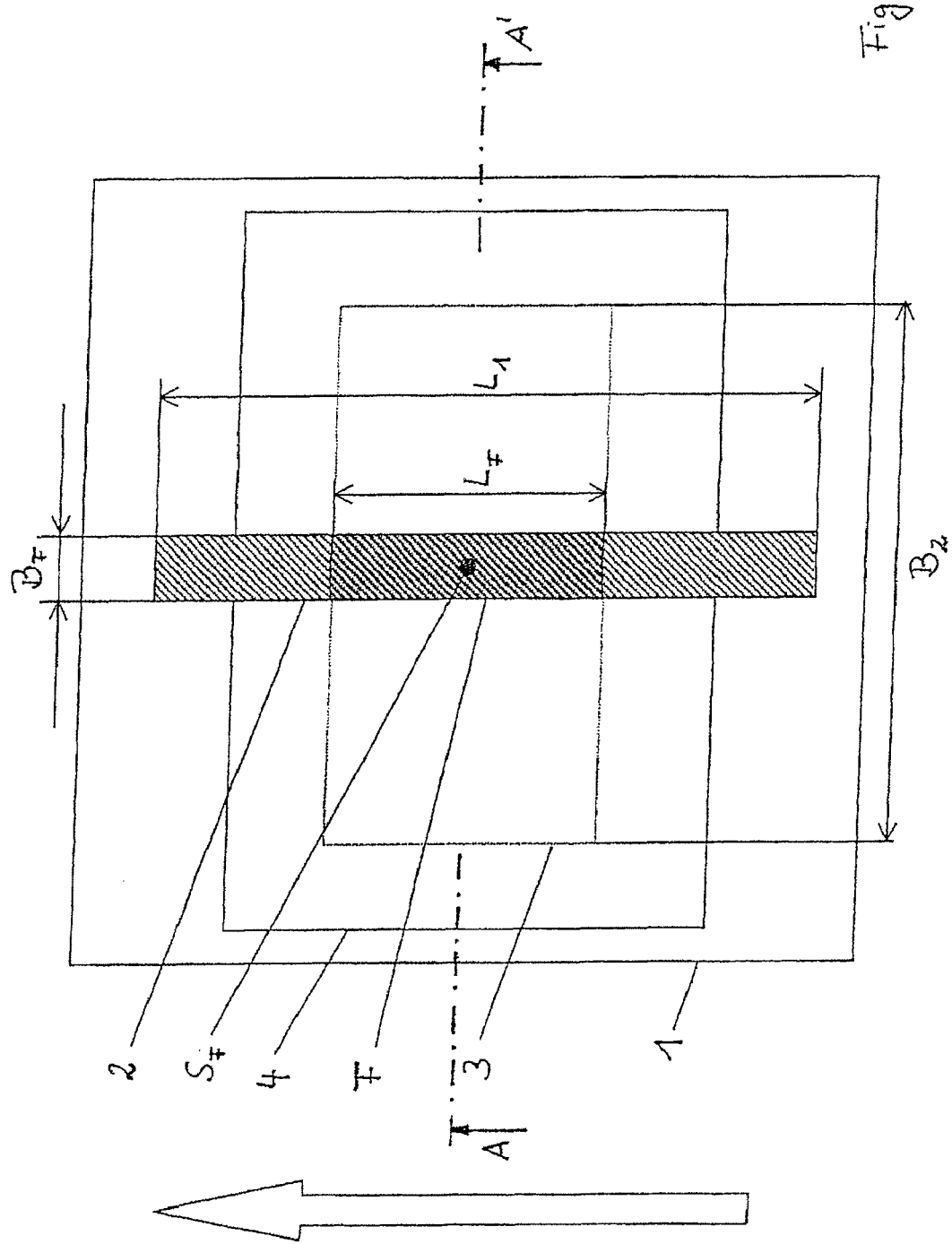

FIG. 1a shows a plan view of the substrate 1 composed of PET film which has been printed with three electrical functional layers 2, 3, 4 in order to produce an electronic component, in this case a diode, on the surface of the substrate 1. Seen at right angles to the surface of the substrate 1, the electrical functional layers 2, 3, 4 are arranged one above the other and overlapping at least in a surface area F. The electrical functional layer 2 in this case forms a first electrical functional layer, with a first length dimension $L_1$ of the first electrical functional layer parallel to the surface of the substrate 1 and in the relative movement direction of the substrate 1 being formed, during the printing process (shown by an arrow on the left in FIG. 1a) to be approximately 25 µm longer than a length dimension $L_F$ of the surface area F in the printing direction and parallel to the surface of the substrate 1. The first electrical functional layer is composed of electrically conductive material, in this case copper, as an electrode. The electrical functional layer 3 forms a second electrical functional layer, which is separated from the first functional layer by a third electrical functional layer 4 composed of poly-3-alkylthiophene. The second electrical functional layer is formed from silver. The second electrical functional layer has been formed such that a second width dimension $B_2$ of the second electrical functional layer parallel to the surface of the substrate 1 and at right angles to the relative movement direction is at least approximately 50 µm wider than a width dimension $B_F$ of the surface area F at right angles to the relative movement direction and parallel to the surface of the substrate 1. The electrically conductive supply lines or interconnects which are, of course, required in order to make electrical contact with the first and second electrical functional layers have not been illustrated.

FIG. 1a shows the ideal situation in accordance with the printing layout for the electronic component, in which the first electrical functional layer is positioned with respect to the surface area F such that a first area centroid of the first electrical functional layer and an area centroid $S_F$ of the surface area F are located one above the other, seen at right angles to the substrate 1, and the second electrical functional layer is positioned with respect to the surface area F such that a second area centroid of the second electrical functional layer and the area centroid $S_F$ of the surface area F are likewise located one above the other, seen at right angles to the substrate 1. In practice, however, this is not the case because of the discrepancies which occur during the structuring process.

The layer structure shown in FIG. 1a is tolerant to any discrepancy or offset such as this of the first functional layer in the relative movement direction and/or any discrepancy or offset of the second functional layer at right angles to the relative movement direction with respect to the illustrated ideal case, in accordance with the layout.

FIG. 1b shows a cross section A-A' through the printed substrate shown in FIG. 1a, in which the substrate 1 and the electrical functional layers 2, 3, 4 printed on it can be seen. In this case, the electrical functional layer 2 forms the first electrical functional layer, the electrical functional layer 3 forms the second electrical functional layer, and the electrical functional layer 4 forms a third electrical functional layer.

FIG. 2a shows a plan view of a further printed substrate 1 composed of PET film, which is printed with three electrical functional layers 2', 3', 4' in order to produce an electronic component, in this case a capacitor, on the surface of the substrate 1. Seen at right angles to the surface of the substrate 1, the electrical functional layer 2', 3', 4' are arranged one above the other and overlapping at least in a surface area F.

The electrical functional layer 2' in this case forms a first electrical functional layer, with a first length dimension $L_1$ of the first electrical functional layer parallel to the surface of the substrate 1 and in the relative movement direction of the substrate 1 being formed, during the printing of the substrate 1 (shown by an arrow on the left in FIG. 2a) to be approximately 1 mm longer than a length dimension $L_F$ of the surface area F in the relative movement direction and parallel to the surface of the substrate 1. The first electrical functional layer is composed of electrically conductive material, in this case copper, as an electrode. The electrical functional layer 3' forms a further electrical functional layer, which is separated from the first functional layer by a third electrical functional layer 4' composed of electrically insulating polymer. The further electrical functional layer is in the form of a silver electrode.

The first electrical functional layer has been formed such that a first width dimension $B_1$ of the first electrical functional layer parallel to the surface of the substrate 1 and at right angles to the relative movement direction is approximately 600 μm wider than a width dimension $B_F$ of the surface area F at right angles to the printing direction and parallel to the surface of the substrate 1. The electrically conductive supply lines or interconnects which are required to make electrical contact with the first and further electrical functional layer have not been illustrated.

FIG. 2a shows the ideal situation for the printing layout for the electronic component, in which the first electrical functional layer is positioned with respect to the surface area F such that a first area centroid of the first electrical functional layer and an area centroid $S_F$ of the surface area F are located one above the other, seen at right angles to the substrate 1, and the third as well as the further electrical functional layer are positioned with respect to the surface area F such that their respective area centroid and the area centroid $S_F$ of the surface area F are likewise located one above the other, seen at right angles to the substrate 1. However, in practice this is not the case because of the discrepancies which occur during the printing process. The layer structure shown in FIG. 2a is tolerant to any discrepancy or offset such as this of the first functional layer in the relative movement direction and/or any discrepancy or offset of the first functional layer at right angles to the relative movement direction with respect to the illustrated ideal case in accordance with the printing layout.

FIG. 2b shows a cross section B-B' through the printed substrate 1 shown in FIG. 2a, in which the substrate 1 and the electrical functional layers 2', 3', 4' printed on it can be seen. In this case, the electrical functional layer 2' forms the first electrical functional layer, the electrical functional layer 3' forms the further electrical functional layer, and the electrical functional layer 4' forms the third electrical functional layer.

FIG. 3a shows a plan view of a further printed substrate 1 composed of PET film, which is printed with two electrical functional layers 2, 3 as an initial stage in the production of an electronic component, in this case by way of example an organic field-effect transistor (OFET), on the surface of the substrate 1. Seen at right angles to the surface of the substrate 1, the electrical functional layers 2, 3 are arranged one above the other and overlapping at least in a surface area F (bounded by a line printed in bold). The electrical functional layer 2 in this case forms a first electrical functional layer, with a first length dimension $L_1$ of the first electrical functional layer parallel to the surface of the substrate 1 and in a relative movement direction of the substrate 1 being formed, during the printing of the substrate 1 (shown by an arrow on the left in FIG. 3a) to be approximately 1 mm longer than a length dimension $L_F$ of the surface area F in the relative movement direction and parallel to the surface of the substrate 1. The first electrical functional layer is formed from semi conductive material, in this case polyalkylthiophene. The electrical functional layer 3 forms a further electrical functional layer. The further electrical functional layer is formed from silver and is configured in the form of two comb structures, which are intended to form the source and drain electrodes of the OFET. Since the electrical functional layer 3 in this case has an irregular shape, the surface area F is in this case defined such that the maximum external dimensions (in the relative movement direction and at right angles to it) of the electrical functional layer 3 predetermine the extent of the surface area F, even though there is no overlap between the two electrical functional layers at any point within the surface area F defined in this way. This definition of the surface area F is expedient in this case since the aim during the printing of the comb structure with the first functional layer is to completely cover the comb structure.

The first electrical functional layer has been formed such that a first width dimension $B_1$ of the first electrical functional layer parallel to the surface of the substrate 1 and at right angles to the relative movement direction is approximately 1 mm wider than a width dimension $B_F$ of the surface area F at right angles to the relative movement direction and parallel to the surface of the substrate 1. The electrically conductive supply lines or interconnects which may be required to make electrical contact with the first and further electrical functional layers have not been illustrated.

FIG. 3a shows the ideal case in accordance with the printing layout for the electronic component, in which the first electrical functional layer is positioned with respect to the surface area F such that a first area centroid of the first electrical functional layer and an area centroid $S_F$ of the surface area F are located one above the other, seen at right angles to the substrate 1, and the further electrical functional layer is positioned with respect to the surface area F such that its area centroid and the area centroid $S_F$ of the surface area F are likewise located one above the other, seen at right angles to the substrate 1. However, in practice, this is not the case because of the discrepancies which occur during the printing process. The layer structure shown in FIG. 3a is tolerant to any such discrepancy or offset of the first functional layer in the relative movement direction and/or any discrepancy or offset of the first functional layer at right angles to the relative movement direction with respect to the illustrated ideal case in accordance with the printing layout.

FIG. 3b shows a cross section C-C' through the printed substrate 1 shown in FIG. 3a, in which the substrate 1 and the electrical functional layers 2, 3 printed on it can be seen. In this case, the electrical functional layer 2 forms the first electrical functional layer, and the electrical functional layer 3 forms a further electrical functional layer.

It should be noted that the figure illustrations 1a to 3b explain the fundamental idea of the invention only by way of example and that there are many further options for the person skilled in the art from the overall context allowing the method according to the invention to also be used to form electrical functional layers of other electrical components in continuous processes, with departing from the subject matter of the invention in the process.

The invention claimed is:

1. A method for producing an electronic component on a surface of a substrate with the electronic component having, seen at a right angle to the surface of the substrate, at least two electrical functional layers arranged one above the other and overlapping at least in a surface area F having a length dimension ($L_F$), with the at least two electrical functional layers on the substrate being structured directly or indirectly with a structuring unit using a continuous process, and with the substrate being moved relative to the structuring unit, the substrate being flexible with a thickness in the range from 6 µm to 200 µm and which substrate is transported from roll to roll during the continuous process, wherein
   a) a first electrical functional layer of the at least two electrical functional layers is structured such that a first length dimension ($L_1$) of the first electrical functional layer in a first direction parallel to the surface of the substrate and in a relative movement direction of the substrate relative to the structuring unit is at least 5 µm longer than the length dimension ($L_F$) of the surface area F in the relative movement direction and in the first direction parallel to the surface of the substrate, and wherein
   b) the first electrical functional layer of the at least two electrical functional layers being structured such that a first width dimension ($B_1$) of the first electrical functional layer parallel to the surface of the substrate and at a right angle to the relative movement direction of the substrate is at least 5 µm wider relative to the structuring unit than a second width dimension ($B_F$) of the surface area F at a right angle to the relative movement direction and parallel to the surface of the substrate.

2. The method as claimed in claim 1 wherein the first length dimension ($L_1$) of the first electrical functional layer in the relative movement direction is 50 to 500 µm longer than the length dimension ($L_F$) of the surface area F in the relative movement direction.

3. The method as claimed in claim 1 wherein the first electrical functional layer is positioned in a layout with respect to the surface area F such that a first area centroid of the first electrical functional layer and an area centroid ($S_F$) of the surface area F are located one above the other, seen at a right angle to the substrate.

4. The method as claimed in claim 1 wherein, for case a) a second electrical functional layer of the at least two electrical functional layers is structured such that a second width dimension ($B_2$) of the second electrical functional layer parallel to the surface of the substrate (1) and at a right angle to the relative movement direction is at least 5 µm wider than a width dimension ($B_F$) of the surface area F at a right angle to the relative movement direction and parallel to the surface of the substrate.

5. The method as claimed in claim 4 wherein the second electrical functional layer is positioned in a layout with respect to the surface area F such that a second area centroid of the second electrical functional layer and the area centroid ($S_F$) of the surface area F are located one above the other, seen at a right angle to the substrate.

6. The method as claimed in claim 1 including utilizing a continuous printing process comprising at least one of intaglio, relief, lithographic, screen or tampo printing process, a laser structuring method, or a photolithographic structuring method.

7. The method as claimed in claim 1 wherein the relative speed of the substrate with respect to the structuring unit during the continuous process is in the range from 0.5 to 200 m/min.

8. The method as claimed in claim 1 wherein an elongated plastic film which may comprise at least one layer comprises the substrate.

9. The method as claimed in claim 8 wherein the thickness of the substrate is in the range from 12 µm to 50 µm.

10. The method as claimed in claim 1 wherein the at least two electrical functional layers are each formed with a layer thickness in the range from 1 nm to 100 µm.

11. The method as claimed in claim 1 wherein the at least two electrical functional layers are each formed with a layer thickness in the range from 10 nm to 300 nm.

12. The method as claimed in claim 1 wherein the at least two electrical functional layers are arranged directly adjacent to one another in the electronic component, seen in the cross section through the substrate.

13. The method as claimed in claim 1 wherein at least one third electrical functional layer is arranged at least in the surface area F in the electronic component between the at least two electrical functional layers, seen in the cross section through the substrate.

14. The method as claimed in claim 13 wherein the at least one third electrical functional layer overhangs the surface area F on all sides, seen at right angles to the surface of the substrate, with a third length dimension of the at least one third electrical functional layer parallel to the surface of the substrate and in the relative movement direction being at least 5 µm longer, than the length dimension ($L_F$) of the surface area F in the relative movement direction and parallel to the surface of the substrate and with a third width dimension of the third electrical functional layer parallel to the surface of the substrate and at a right angle to the relative movement direction being at least 5 µm wider than a width dimension ($B_F$) of the surface area F at a right angle to the relative movement direction and parallel to the surface of the substrate.

15. The method as claimed in claim 1 including forming the first electrical functional layer as an organic electrode or electrodes.

16. The method as claimed in claim 1 including forming one of the at least two electrical functional layers into an electrical organic isolation layer or a semiconductor layer.

17. The method as claimed in claim 1 including forming the one of the at least two electrical functional layers into one or more organic electrode or electrodes.

18. The method as claimed in claim 1 including forming at least one organic electrical functional layer from the at least two functional layers and forming the at least one organic functional layer into the electronic component including at least one of a field-effect transistor, a capacitor, a diode or an electronic component containing at least one via.

* * * * *

UNITED STATES PATENT AND TRADEMARK OFFICE
CERTIFICATE OF CORRECTION

PATENT NO. : 7,846,838 B2
APPLICATION NO. : 11/997235
DATED : December 7, 2010
INVENTOR(S) : Alexander Knobloch et al.

It is certified that error appears in the above-identified patent and that said Letters Patent is hereby corrected as shown below:

Title page, item [73] Assignee:

from "Polyic GmbH & Co. KG"

to -- PolyIC GmbH & Co. KG --

Signed and Sealed this
Fifth Day of April, 2011

David J. Kappos
*Director of the United States Patent and Trademark Office*